Dec. 24, 1957 E. DURBIN 2,817,757

ELECTRONIC SWITCHING CIRCUIT

Filed Sept. 30, 1954

INVENTOR
EDWARD DURBIN
BY
B. F. Spencer
AGENT 2,817,757

ELECTRONIC SWITCHING CIRCUIT

Edward Durbin, Valley Stream, N. Y., assignor to Sperry Rand Corporation, a corporation of Delaware Application September 30, 1954, Serial No. 459,400
7 Claims. (Cl. 250—27)

Figure 1:
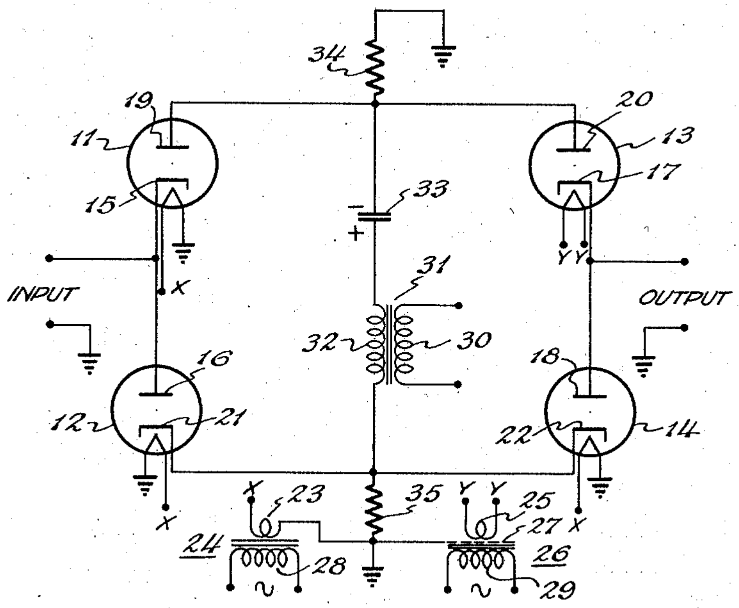

The present invention relates to switching circuits, and in particular to an improvement in the four-diode electronic switch.

The four-diode switch is well known in the art. One modification of this switch is shown and described on page 374 of the book "Waveforms," published by the McGraw-Hill Book Company, 1949. This switch operates as a single-pole, single-throw switch which is closed during an applied switching pulse and is open during the interval between switching pulses. The applied signal to be switched appears at the output substantially unaltered in magnitude during the time interval that the switch is closed.

The four-diode switch is frequently employed to charge a condenser coupled across its output terminals to the value of an applied voltage during the interval that the switch is closed. The condenser retains its charge during the interval between switching pulses. Patent No. 2,250,284 includes a description of this type of electronic switch.

In using the four-diode switch to periodically sample an applied voltage during each switching pulse and to store the value of the applied voltage in a condenser coupled across its output terminals in the interval between switching pulses, it has been observed that the condenser tends to discharge in the interval between switching pulses at a faster rate than would be expected. Upon investigation, it has been discovered that certain of the diodes of the switch have been found to conduct current in the interval between switching pulses when they should be non-conductive. This undesired conduction has been found to occur in a particular pair of diodes coupling the input terminal of the switch to the output terminal. Accordingly, the condenser tends to discharge through the switch and the source of the applied signal. This undesired conduction has been found to be an inherent characteristic of these prior art four-diode switches, and this characteristic seriously impairs the operation of the switch in certain applications. The present invention is concerned with the solution of this problem.

Accordingly, the principal object of the present invention is to provide an improved electronic switching circuit that remains open throughout the interval between switching pulses.

Another object of the invention is to provide an improved four-diode electronic switch having a higher internal impedance between its input and output terminals in the interval between applied switching pulses.

In accordance with the present invention there is introduced an improved four-diode switch having a pair of resistors coupled in series between the intercoupled anodes of two of the diodes and the intercoupled cathodes of the other two diodes. The junction of the series coupled resistors is coupled to one of the input terminals. The bias voltage automatically developed upon conduction of the diodes during the applied switching pulses is substantially equally divided between these resistors. The two resistors maintain substantially equal impedances across each of the diodes with the result that the bias voltage developed is equally distributed among the diodes. The equal distribution of bias voltage maintains the diodes non-conductive throughout the interval between switching pulses.

Figure 2:
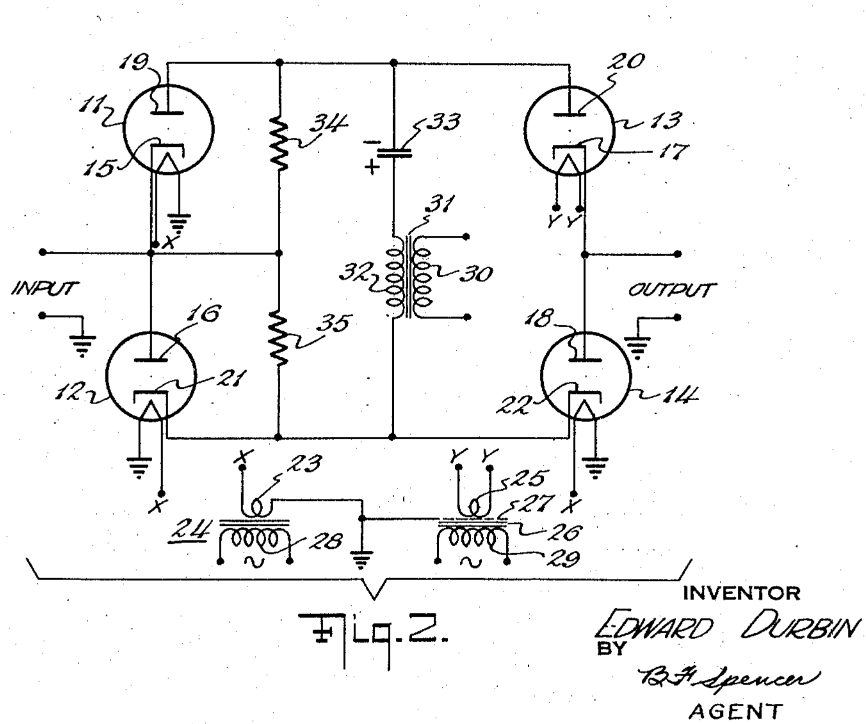

The above objects of and the brief introduction to the present invention will be more fully understood and further objects and advantages will become apparent from a study of the following detailed description in connection with the drawings, wherein, Fig. 1 illustrates the preferred embodiment of the improved four-diode switch of the present invention; and Fig. 2 illustrates an alternative embodiment of the invention.

Referring to Fig. 1, the four diodes 11, 12, 13 and 14 are intercoupled in the conventional manner with the cathode 15 of the first diode 11 coupled to the anode 16 of the second diode 12, and with the cathode 17 of the third diode 13 coupled to the anode 18 of the fourth diode 14. Anodes 19 and 20 of diodes 11 and 13 are coupled together, and cathodes 21 and 22 of diodes 12 and 14 are coupled together. One of the input terminals of the four-diode switch is coupled to the junction of the first pair of diodes 11 and 12, and the other input terminal is coupled to ground. One of the output terminals is coupled to the junction of the second pair of diodes 13 and 14, and the other output terminal is coupled to ground.

The heaters of diodes 11, 12 and 14 are energized by the alternating voltage across the secondary winding 23 of transformer 24. One terminal of each of these heaters and one terminal of the secondary winding 23 is grounded. The heater of diode 13 is energized by the voltage across the secondary winding 25 of isolation transformer 26. Neither the heater terminals of diode 13 nor the secondary winding 25 is grounded. Isolation transformer 26 is provided with an electrostatic shield 27 coupled to ground. The primary windings 28 and 29 of the transformers 24 and 26 are excited by a suitable alternating voltage.

The four diodes are energized by a switching voltage applied to the primary winding 30 of transformer 31. The secondary winding 32 and condenser 33 are coupled in series across the first and second pairs of diodes. When the switching voltage induced in the secondary winding 32 impresses a positive potential on the intercoupled anodes 19 and 20 with respect to the intercoupled cathodes 21 and 22, the four diodes conduct current simultaneously thereby closing the switch. The magnitude of the positive switching voltage must be appreciably larger than the magnitude of the input voltage to insure that the four diodes will remain non-conductive throughout the interval between switching pulses.

During conduction of the four diodes, condenser 33 becomes charged to a value substantially equal to the peak magnitude of the applied switching pulses and with the polarity as shown. In the interval between switching pulses, this voltage across the condenser biases the four diodes, rendering them non-conductive and thereby opening the switch.

In the prior art four-diode switches, a single resistor is coupled in parallel with the condenser 33 to provide a discharge path for the condenser. In the present invention, instead of a single resistor coupled in parallel with the condenser, a pair of resistors 34 and 35 of substantially equal value are coupled in series across the first and second pairs of diodes. The junction of these two resistors is coupled to ground in the preferred embodiment of Fig. 1, and is coupled to the junction of the first pair of diodes 11 and 12 in the alternative embodiment of Fig. 2. The addition of resistors 34 and 35 as shown in Figs. 1 and 2 results in a paramount improvement in the performance of the four-diode switch. This improvement may be understood by examining the operation of the prior art four-diode switch as contrasted to the improved four-diode switch of the present invention.

The undesired conduction encountered in the prior art four-diode switch occurs because certain of the diodes are not biased beyond cut-off throughout the interval between switching pulses. Upon investigation, it has been discovered that the automatic bias developed during switching pulses is not equally distributed among the four diodes. This distribution of the bias voltage occurs in the following manner. The potential between the junction of the first pair of diodes and ground is established by the applied signal to be switched. The potential between the junction of the second pair of diodes and ground is determined by the value of the applied signal at the instant of the switching pulse when a condenser is coupled across the output terminals. This potential is zero if a resistor is coupled across the output terminals instead of a condenser. The direct bias potential existing between the intercoupled anodes of the first and third diodes and ground is larger than the bias potential between the intercoupled cathodes of the second and fourth diodes and ground. This difference in potential exists because the resistance path between the intercoupled anodes and ground is appreciably larger than the resistance path between the intercoupled cathodes and ground. The back resistance of the first and third diodes from anode to cathode is very much larger than the leakage resistance which exists from the cathodes to the heaters of the second and fourth diodes. If for the moment the input signal to be switched is assumed to be zero, it is seen that the bias voltage distributed across each of the first and third diodes is larger than the bias voltage across the second and fourth diodes of the prior art four-diode switch. As a result, the second and fourth diodes are more likely to become conductive in the interval between switching pulses than the first and third diodes. This is especially true if the prior art four-diode switch is sampling and storing a positive input voltage since the bias voltage across the fourth diode will be reduced by the amount of the stored positive potential across the external condenser at the output terminals of the switch. Thus, the bias voltage across the second and fourth diodes may be reduced to such value as to allow these diodes to become conductive in the interval between switching pulses.

The back resistance of diodes is very high in comparison with the cathode to heater leakage. To more equally divide the bias voltage developed across condenser 33 among the four diodes, the resistor 34 of Fig. 1, whose value is approximately one-half or less the value of the leakage resistance from heater to cathode, is coupled from the intercoupled anodes 19 and 20 to ground. The resistor 35, whose value is substantially equal to the value of resistor 34, is coupled from the intercoupled cathodes 21 and 22 to ground. This connection of resistors 34 and 35 insures that the bias voltage developed across condenser 33 will be equally divided across the two resistors. As a result, the bias voltage across the second and fourth diodes 12 and 14 is appreciably greater than the bias voltage across the corresponding diodes of the prior art four-diode switch. With substantially equal bias voltages across each of the four diodes of the improved switch of the present invention, the problem of diode conduction in the interval between switching pulses is eliminated.

Fig. 2 illustrates an alternative embodiment of the improved four-diode switch. The elements of Fig. 2 are identical with those of Fig. 1 and are identified by the same reference numerals. The junction of resistors 34 and 35 is coupled to the junction of the first pair of diodes 11 and 12. This embodiment requires a source of input signal whose internal impedance is small compared with the value of resistors 34 and 35. The automatic bias voltage developed across condenser 33 divides substantially equally between the two resistors, and the conduction between switching pulses is eliminated.

The heater of diode 13 is energized by a voltage obtained from the isolating transformer 26 in Figs. 1 and 2 to prevent the leakage from cathode to heater of diode 13 from existing across the output terminals. A leakage path between the junction of the second pair of diodes and ground would discharge an external condenser coupled across these terminals. The isolation transformer 26 with grounded electrostatic shield 27 enables the secondary winding 25 and the heater to operate above ground potential, thereby greatly increasing the resistance path across the output terminals.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An electronic switch comprising in combination, a first pair of diodes coupled in series, the cathode of the first diode being coupled to the anode of the second diode, a second pair of diodes coupled in series, the cathode of the third diode being coupled to the anode of the fourth diode, means coupling the anode of said first diode to the anode of said third diode, means coupling the cathode of said second diode to the cathode of said fourth diode, means adapted for supplying an input voltage to be switched between the junction of said first pair of diodes and a common ground terminal, the switched output voltage appearing between the junction of said second pair of diodes and said common ground terminal, means for supplying a switching voltage to said first and second pairs of diodes, said means including a condenser and a transformer having primary and secondary windings, said condenser and said secondary winding coupled in series between the intercoupled anodes of said first and third diodes and the intercoupled cathodes of said second and fourth diodes, said primary winding being adapted for receiving the applied switching voltage, and means for maintaining substantially equal bias voltages across said diodes including a first resistor coupled between said intercoupled anodes and said common ground terminal and a second resistor coupled between said intercoupled cathode and said common ground terminal, said first and second resistors forming a series coupled circuit in shunt with said series coupled condenser and secondary winding for providing a discharge path for said condenser through said secondary winding and said resistors.

2. An electronic switch comprising in combination, four diodes coupled in series as a ring with the cathode of the first diode coupled to the anode of the second diode, and the cathode of the third diode coupled to the anode on the fourth diode, the anodes of said first and third diodes being coupled together and the cathodes of said second and fourth diodes being coupled together, means adapted for supplying an input voltage to be switched between the junction of said first and second diodes and a common ground terminal, means adapted for removing the switched output voltage from the junction of said third and fourth diodes and said common ground terminal, means for supplying a switching voltage between the intercoupled anodes of said first and third diodes and the intercoupled cathodes of said second and fourth diodes, said means including a condenser and a transformer having primary and secondary windings, said condenser being coupled in series with said secondary winding between the intercoupled anodes of said first and third diodes and the intercoupled cathodes of said second and fourth diodes, the primary winding of said transformer being adapted for receiving said switching voltage, and means for maintaining substantially equal bias voltages across said diodes including a first resistor coupled between the intercoupled anodes of said first and third diodes and said common ground terminal and a second resistor coupled between said intercoupled cathodes of said second and fourth diodes and said common ground terminal, said first and second resistors being substantially equal in value, said first and second resistors forming a series coupled circuit in shunt with said series coupled condenser and secondary winding for providing a discharge path for said condenser through said secondary winding and said resistors.

3. An electronic switch comprising in combination, a first pair of rectifier elements coupled in series, a second pair of rectifier elements coupled in series, said second pair of series coupled rectifier elements coupled in parallel with said first pair of series coupled rectifier elements, means adapted for coupling an input voltage between the junction of said first pair of rectifier elements and a common ground terminal, means for simultaneously passing a current through said first and second pairs of rectifier elements, said means including a condenser and a transformer having a primary and a secondary winding, said condenser and said secondary winding being coupled in series across said first and second pairs of rectifier elements, said primary winding adapted to receive an applied switching voltage, the input voltage applied between the junction of said first pair of rectifier elements and said common ground terminal appearing between the junction of said second pair of rectifier elements and said common ground terminal when said rectifier elements are conducting current, and means for maintaining substantially equal bias voltages across each of said rectifier elements, said means including first and second resistors coupled in series, said series coupled resistors being coupled in parallel with said first and second pairs of rectifier elements, the junction of said first and second resistors being coupled to one of the terminals adapted for receiving said input voltage, said series coupled resistors being further coupled in parallel with said series coupled condenser and secondary winding for providing a discharge path for said condenser through said secondary winding and said series coupled resistors.

4. A switching system comprising in combination, a first pair of rectifier elements coupled in series, a second pair of rectifier elements coupled in series, said second pair of series coupled rectifier elements coupled in parallel with said first pair of series coupled rectifier elements, first input terminal means coupled to the junction of said first pair of series coupled rectifier elements, second input terminal means coupled to a common ground, said first and second input terminals adapted to receive an applied signal to be switched, first output terminal means coupled to the junction of said second pair of series coupled rectifier elements, second output terminal means coupled to said common ground, said first and second output terminals adapted to supply the switched output signal, means adapted for supplying a switching signal across said first and second pairs of rectifier elements, said last mentioned means including a condenser and a transformer having a primary and a secondary winding, said condenser and the secondary winding of said transformer being coupled in series across said first and second pairs of rectifier elements, said primary winding being adapted for receiving said switching signal, said switching signal causing said first and second pairs of rectifier elements to conduct current simultaneously, and first and second resistor means coupled in series, said series coupled resistor means being coupled in parallel with said first and second pairs of rectifier elements, the junction of said first and second resistor means being coupled to one of said input terminals, said series coupled resistor means forming a direct current path in parallel with said means adapted for supplying a switching signal across said first and second pairs of rectifier elements.

5. A switching system comprising in combination, a first pair of rectifier elements coupled in series, a second pair of rectifier elements coupled in series, said second pair of series coupled rectifier elements coupled in parallel with said first pair of series coupled rectifier elements, means adapted for supplying a switching signal across said first and second pairs of rectifier elements, said means including a condenser and a transformer having a primary and a secondary winding, said condenser and said secondary winding being coupled in series across said first and second pairs of rectifier elements, said primary winding adapted to receive an applied switching signal, said switching signal causing said first and second pairs of rectifier elements to conduct current simultaneously thereby charging said condenser, and means for dividing the charge produced in said condenser equally across said first and second pairs of rectifier elements including first and second resistor means coupled in series, said series coupled resistor means being coupled in parallel with said first and second pairs of rectifier elements, the junction of said first and second resistor means being coupled to a common ground terminal, said series coupled resistor means being further coupled in parallel with said series coupled condenser and secondary winding for providing a discharge path for said condenser through said secondary winding and said series coupled resistor means.

6. An electronic switch comprising in combination, a first pair of diodes coupled in series, the cathode of the first diode being coupled to the anode of the second diode, a second pair of diodes coupled in series, the cathode of the third diode being coupled to the anode of the fourth diode, means coupling the anode of said first diode to the anode of said third diode, means coupling the cathode of said second diode to the cathode of said fourth diode, means adapted for supplying an input voltage between a first input terminal coupled to the junction of said first pair of diodes and a second input terminal coupled to ground, the switched output voltage appearing between the junction of said second pair of diodes and ground, means for supplying a switching voltage to said first and second pairs of diodes, said means including a condenser and a transformer having primary and secondary windings, said condenser and said secondary winding being coupled in series between the intercoupled anodes of said first and third diodes and the intercoupled cathodes of said second and fourth diodes, said primary winding being adapted for receiving the applied switching voltage, said switching voltage causing said first and second pairs of diodes to conduct current simultaneously thereby charging said condenser, and means for dividing the charge produced in said condenser equally across said first and second pairs of diodes including resistor means having one of its terminals coupled to the intercoupled anodes of said first and third diodes and having its other terminal coupled to one of said first or second input terminals, said resistor means and the leakage resistance from the intercoupled cathodes of said second and fourth diodes and ground forming a series coupled circuit in shunt with said series coupled condenser and secondary winding for providing a discharge path for said condenser through said secondary winding, said resistor means, and the leakage resistance between the intercoupled cathodes of said second and fourth diodes and ground.

7. The electronic switch as defined in claim 6 wherein the value of said resistor means is substantially equal to the total resistance between the intercoupled cathodes of said second and fourth diodes and ground.

References Cited in the file of this patent

UNITED STATES PATENTS

| | | |
|---|---|---|
| 2,443,195 | Pensyl | June 15, 1948 |
| 2,563,406 | Goldberg | Aug. 7, 1951 |